United States Patent [19]
Vora et al.

[11] Patent Number: 5,668,495
[45] Date of Patent: *Sep. 16, 1997

[54] BICMOS REPROGRAMMABLE LOGIC

[75] Inventors: Madhukar B. Vora, Los Gatos; Burnell G. West, Freemont, both of Calif.

[73] Assignee: DynaChip Corporation, Sunnyvale, Calif.

[*] Notice: The term of this patent shall not extend beyond the expiration date of Pat. No. 5,355,035.

[21] Appl. No.: 639,272

[22] Filed: Apr. 23, 1996

Related U.S. Application Data

[62] Division of Ser. No. 375,303, Jan. 20, 1995, Pat. No. 5,570,059, which is a continuation of Ser. No. 274,817, Jul. 14, 1994, Pat. No. 5,406,133, which is a division of Ser. No. 2,172, Jan. 8, 1993, Pat. No. 5,355,035.

[51] Int. Cl.$^6$ .................. H03K 17/60; H03K 17/62
[52] U.S. Cl. .................. 327/432; 327/407; 327/108
[58] Field of Search .................. 327/407, 408, 327/411, 432, 433, 65, 66, 67, 403, 404, 405, 415, 416, 417, 374, 376, 377, 108; 326/104, 109, 110, 126, 127

[56] References Cited

U.S. PATENT DOCUMENTS

| | | | |
|---|---|---|---|
| 3,638,131 | 1/1972 | Sarkissian | 327/411 |
| 4,214,213 | 7/1980 | Ferrie | 327/407 |
| 4,517,476 | 5/1985 | Barre | 307/455 |
| 4,611,130 | 9/1986 | Swanson | 327/65 |
| 4,724,339 | 2/1988 | Ishida | 327/65 |
| 4,812,684 | 3/1989 | Yamagiwa | 307/443 |
| 4,963,767 | 10/1990 | Sinh | 326/126 |
| 5,043,602 | 8/1991 | Flannagan | 307/455 |
| 5,045,725 | 9/1991 | Sasaki | 307/443 |
| 5,045,804 | 9/1991 | Sugawara et al. | 327/411 |
| 5,066,877 | 11/1991 | Humano | 307/603 |
| 5,172,330 | 12/1992 | Watanabe | 307/480 |
| 5,196,733 | 3/1993 | Shin | 307/243 |
| 5,289,048 | 2/1994 | Ishihara | 327/407 |
| 5,298,810 | 3/1994 | Scott | 307/475 |
| 5,355,035 | 10/1994 | Vora et al. | 327/433 |

FOREIGN PATENT DOCUMENTS

| | | |
|---|---|---|
| 0 436 876 A2 | 12/1990 | European Pat. Off. . |
| A 40 30 631 A1 | 9/1990 | Germany . |
| A 59 107 637 | 6/1984 | Japan . |
| A 04 360 311 | 12/1992 | Japan . |

*Primary Examiner*—Toan Tran
*Attorney, Agent, or Firm*—Ron Fish; Falk & Fish, LLP

[57] ABSTRACT

A high speed switching technology suitable for implementing field programmable gate arrays using current mode logic in the high speed data path, and CMOS steering logic outside the high speed data path to enable the high speed switching logic and to implement multiplexer, selector and crossbar switch functions. High speed emitter follower logic compatible with the high speed switching logic for level shifting, buffering, and providing more current sink or source capacity is also disclosed.

9 Claims, 4 Drawing Sheets

BICMOS REPROGRAMMABLE LOGIC

The present application is a divisional of U.S. patent application Ser. No. 08/375,303, filing date Jan. 20, 1995 now U.S. Pat. No. 5,570,059 which was a continuation of U.S. patent application Ser. No. 08/274,817 filing date Jul. 14, 1994 now U.S. Pat. No. 5,406,133 which was a divisional of U.S. patent application Ser. No. 08/002,172, filing date Jan. 8, 1993 now U.S. Pat. No. 5,355,035 all of which were complete applications and not provisional applications.

BACKGROUND OF THE INVENTION

The invention pertains to the field of custom circuits, and, more particularly, to the field of components and cells from which field reprogrammable logic circuits may be constructed and field programmable logic circuits themselves.

Logic designers have long had the need for custom logic circuits to implement their designs. In the 1970's, this need gave rise to programmable logic arrays, programmable array logic and programmable read only memory. Later in the decade, custom circuits were made by customizing the metal layer of integrated circuits which had standard cells formed in the layers below the metal layer. The customized metal layer interconnected the standard cells in a manner defined by the customer of the gate array manufacturer.

Gate arrays are only a good choice where the desired function to be performed by the gate array can be determined with certainty in advance. However, gate arrays are not a good choice where the desired function can change over time with changing requirements. This can happen when a circuit design is being evaluated and testing over time reveals the need for changes in the design. Another shortcoming of gate arrays was that they could not perform the function of packet encapsulation and delivery in network settings where packet construction was subject to a variety of different protocols and where packet headers change as the packets circulate, for example in token ring networks. This function has been done in software in the prior art, but increasing network speeds demands more speed which requires that this function be done in hardware.

Another application in which fixed gate arrays had shortcomings in where data flow paths change over time as a function of changes in the process that is being emulated by a particular circuit. Thus, a need arose for more flexibility in custom circuits such that the functions thereof can be changed.

Reprogrammable gate arrays, also called field programmable gate arrays or FPGAs, were developed in response to this need. However, these gate arrays were implemented in CMOS technology. Although CMOS has significant advantages such as low power, high circuit density, good reliability and low cost, CMOS is not fast enough for very high speed custom circuits needed in applications such as supercomputers, communication systems, high speed workstations, networks, automatic test equipment, parallel processor interconnects and design emulation systems. In very fast applications such as these, having any MOS device in the signal path seriously impedes the switching speed and impairs the performance of the machine. This is because the resistivity of CMOS and MOS devices is too high, and this coupled with the junction capacitances and other capacitances intrinsic to MOS devices causes delays.

Accordingly, the need has arisen lot a much faster technology that can be substituted for field programmable gate array circuits in extremely high speed applications.

SUMMARY OF THE INVENTION

According to the teachings of the invention, reprogrammable logic circuitry is implemented with multiplexer cells using high speed devices such as ECL circuitry in the data path with CMOS devices doing the function of steering the high speed signals in the data path to one or more of the high speed devices. In other words, the CMOS devices are generally kept out of the data path and only are used to program the selection of which input signals are coupled to which outputs through the high speed devices. In the preferred embodiment, the high speed devices are ECL technology devices, but in other embodiments, they may be bipolar devices or any other high speed technology.

In one embodiment of the invention, a high speed selector is implemented in differential current mode logic with CMOS steering transistors to enable the high speed switching transistors with the CMOS devices out of the high speed data path. This embodiment uses a pair of differentially coupled ECL transistors for each of a plurality of output pairs of high speed, complementary data output signals. Each of these paris of ECL switching transistors have bases which are coupled to a shared pair of inputs for receiving a pair of high speed, complementary data inputs. Each of these pairs of ECL switching transistors also shares a common emitter node coupled selectively to the low voltage supply by a constant current source and an NMOS transistor which is part of the enabling mechanism. This enabling transistor is out of the high speed data path, and receives a steering signal which in one state turns the NMOS transistor and couples the constant current source to the low voltage supply thereby enabling the switching transistors. The other state of the steering signal turns the NMOS transistor off thereby disconnecting the constant current source from the low voltage supply and disabling the switching transistors. The other part of the enabling mechanism is a PMOS transistor which is coupled to the steering signal and selectively couples the common emitter node to the high voltage supply. When the NMOS transistor is on, the PMOS transistor is off thereby allowing the ECL transistors to operate in differential mode. When the NMOS transistor is off, the PMOS transistor is on and lifts the common emitter node to the voltage of the high voltage supply thereby turning the ECL transistors off by reverse biasing their base-emitter junctions.

In another embodiment of the teachings of the invention, a multiple-input, single-output multiplexer is disclosed. The basic ECL switching cell used in this multiplexer is the same except that one differentially coupled ECL pair is coupled to one pair of high speed data inputs and the shared pair of high speed differential outputs, and is coupled to the high voltage supply through a pair of pull up resistors. All other differential pairs coupled to high speed data input pairs are coupled to the same shared pair of high speed data outputs and share the single set of pullup resistors. Each differential pair of ECL transistors has its own constant current source and its own enabling circuitry and has a dedicated steering signal coupled to the corresponding enabling circuit. The enabling circuitry is identical to the enabling circuitry described for the selector and works the same way and has the same attributes.

In another embodiment of the invention a multiple-input, multiple-output crossbar switch can be implemented using the multiple-input, single-output multiplexer described above. In this embodiment, a first series of high speed data input pairs are coupled to a series of differentially coupled ECL switches linked together to share a common high speed data output pair in the manner just described for the multiplexer. Another series of high speed, differentially coupled ECL switches coupled together so as to share a second high speed, complementary data output pair which is common only to this second series of ECL switch pairs as described above for the multiplexer structure is then coupled so as to share the same high speed, complementary data inputs used by the first series of differentially coupled ECL switches. This structure can be repeated for a large number of series of such multiplexers sharing the same input signals to extend the number of outputs in the crossbar switch, the upper limit being more a function of how much degradation of the switching speed is tolerable under the circumstances. This switching speed degradation is a function of the number of ECL switching pairs which load each high speed data input.

Another embodiment according to the teachings of the invention is a high speed emitter follower structure which can be used in conjunction with the foregoing structures for level shifting, output buffering, increasing the output current source or sink capacity or in a stand-alone mode to implement another form of a cross-bar switch. In this embodiment, a bipolar transistor such as an ECL device is coupled as an emitter follower to a constant current source. The high speed data input is selectively coupled to the base of the emitter follower through a PMOS transistor which is part of the enabling circuitry. The constant current source is coupled to the low voltage supply selectively through an NMOS transistor which also is part of the enabling circuitry. Another NMOS transistor selectively couples the base of the emitter follower transistor to the low voltage supply. Multiple structures or "cells" like the structure just described can be used, with each such cell being coupled to one high speed data input and one high speed data output. Each cell receives two complementary steering signals which enable or disable it. When the steering signals are in a state to enable the cell, the first NMOS transistor coupled to the first steering signal couples the constant current source to the low voltage supply, and the second NMOS transistor coupled to the second steering signal decouples the base of the emitter follower from the low voltage supply. The PMOS transistor in the enabling circuitry coupled to the second steering signal, then couples the high speed data input to the base of the emitter follower. In the second, complementary state of the steering signals, the base of the emitter follower is decoupled from the high speed data input and coupled to the low voltage supply to reverse bias the base-craftier junction. Simultaneously, the constant current source is decoupled from the low voltage supply thereby disabling the emitter follower further. Multiple such cells coupled to multiple inputs and outputs can be used to implement selectors, multiplexers or crossbar switches.

The structures just described can also be implemented using single ended ECL logic, non-current mode bipolar logic or other types of high speed technologies wherein the enabling circuitry that provides field programmability can be implemented in CMOS or other switching technologies which, although slower, can be kept out of the data path. Generally, current mode logic is preferred for the switching technology because of its speed, and CMOS technology is preferred for the enabling switches because of its small size and low power consumption. Low power consumption is important especially in integrated ECL switching embodiments; because the ECL transistors dissipate large amounts of power, and this power must be dissipated which can be a problem for highly dense integrated structures. If the power is not properly dissipated and the temperature of the chip kept under control, thermal runaway problems and temperature compensation problems become a factor to be dealt with thereby complicating the design and increasing the expense and complexity thereof. Further, yield for integrated circuit production decreases when die size is increased which occurs when either more transistors are added or when the same number of transistors are implemented in technologies which are larger per transistor in terms of chip real estate consumed. Since every ECL pair and every emitter follower needs two or more enabling transistors, effectively doubling or tripling the density per switching function, it is especially useful to implement the enabling function in CMOS so as to not aggravate the power dissipation problem. Further, since MOS transistors are smaller than corresponding bipolar transistors, implementing the enabling function in CMOS uses less area and allows more switching functions to be put on the same die or allows the same number of switching functions to be put on a smaller die. Therefore, the characteristics of ECL and CMOS technologies are preferred when the circuits according to the teachings of the invention are to be fabricated as integrated circuits.

However, where chip real estate, switching speed or power consumption are not issues, bipolar or other switching enabling technology can be used to enable the switches in the high speed data path. Also, other types of architectures or other slower, cheaper, smaller or otherwise different technologies may be used for the switches in the high speed data path.

DETAILED DESCRIPTION OF THE PREFERRED EMBODIMENT

Figure 1:
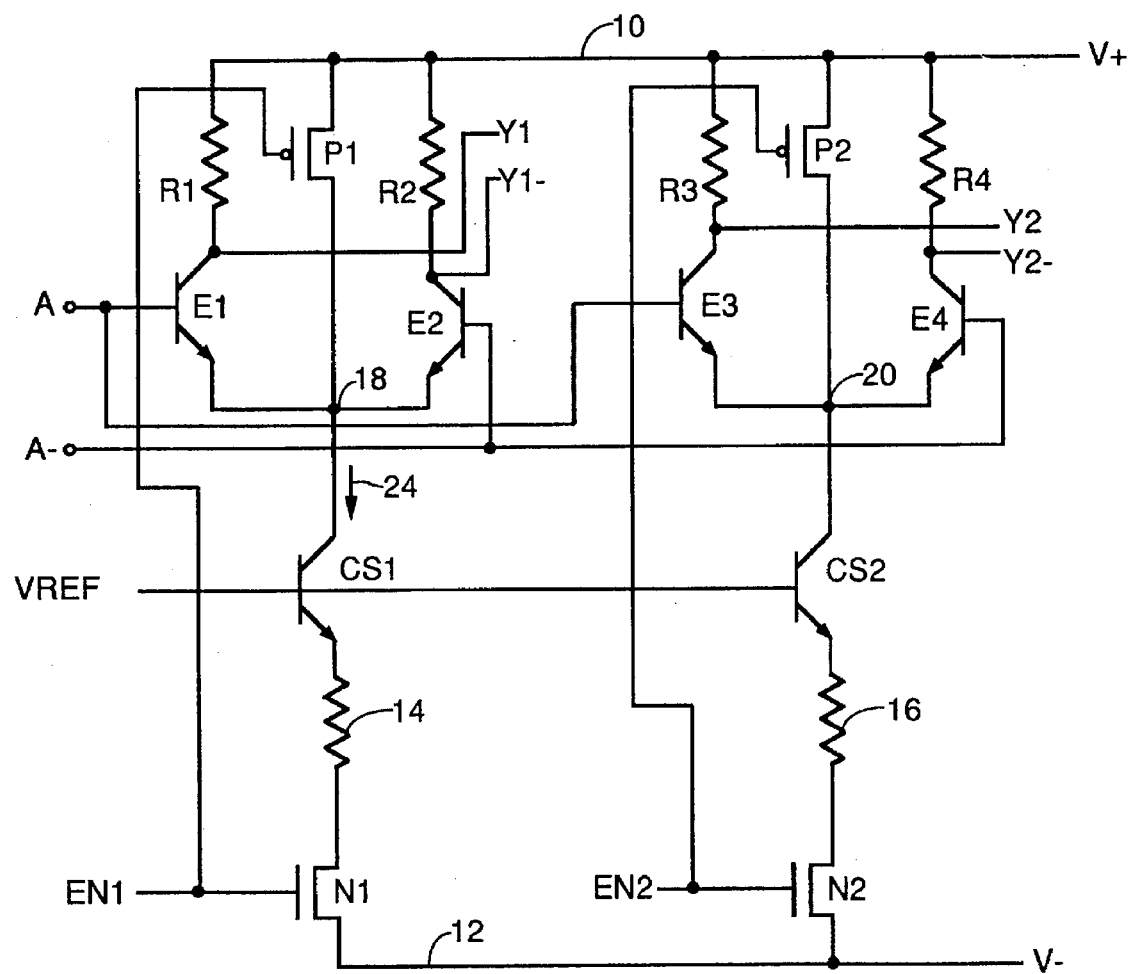
FIG. 1 is a circuit diagram of the preferred embodiment of multiplexer according to the teachings of the invention.

Referring to FIG. 1, there is shown a circuit diagram for a one-input-two-output multiplexer according to the teachings of the invention suitable for use in implementing programmable logic circuitry. In the embodiment shown in FIG. 1, emitter-coupled-logic (ECL) circuitry is used in the data path, and CMOS circuitry is used for steering the input signals from the inputs to one or more of the outputs. In other embodiments, other fast technologies may be used in the data path such as bipolar, Josephson junction, ballistic effect devices etc. The data inputs for high speed data are shown at A and A-. These two inputs are coupled to two ECL differential pairs comprised of a first pair of transistors E1 and E2 and a second pair of transistors E3 and E4. Transistors E1 and E2 have load resistors R1 and R2, respectively. Transistors E3 and E4 have load resistors R3 and R4, respectively. The first data input A is coupled to the bases of ECL transistors E1 and E3. The complementary data input A- is coupled to the bases of ECL transistors E2 and E4. The collectors of the E1 and E2 pair are coupled to the Y1 and Y1- outputs, respectively. The collectors of the E3 and E4 pair are coupled to the Y2 and Y2- outputs, respectively. Each of the ECL transistors is coupled to the high voltage supply rail 10 via a collector load resistor where R1 is the load resistor lot transistor E1 and R4 is the load resistor for E4 etc.

The emitters of transistors E1 and E2 are coupled so as to share a common constant emitter current regulated by current source transistor CS1, and the emitters of transistors E3 and E4 are coupled so as to share a common constant emitter current regulated by current source transistor CS2. The bases of these two current source transistors are coupled to a reference voltage VREF, and the emitters are coupled to the low voltage supply 12 through emitter feedback resistors 14 and 16 and through NMOS steering transistors N1 and N2. The gate terminals of transistors N1 and N2 are coupled to enable signal lines EN1 and EN2, respectively. These two enable signal lines are also coupled to two PMOS steering transistors P1 and P2, respectively, which are coupled between the high voltage supply 10 and the common emitter nodes 18 and 20.

The operation of the circuit 1 is as follows. The fundamental purpose of the circuit is to steer the signals in the data path on complementary signal lines A and A- onto one or both of the complementary output signal pairs Y1/Y1- or Y2/Y2- to implement a one-input-two-output multiplexer. This is done using the EN1 and EN2 enable or steering signals and the CMOS steering transistor pairs N1/P1 and N2/P2 outside the data path. Those skilled in the art will appreciate that the concept illustrated in the circuit of FIG. 1 can be extended to more outputs than two and can be reversed to steer input signals on one of a plurality of inputs onto a single output.

Assuming now for illustration that the EN1 enable signal is active, i.e., high. This causes the steering transistor N1 to conduct thereby connecting the steering transistor N1 to the low voltage power supply and causes the steering transistor P1 to be nonconductive. This has the effect of activating the output pair Y1 and Y1- by enabling the current source CS1 to draw the fixed current represented by arrow 24 out of node 18. Current source transistor CS1 stabilizes the current flow out of node 24 by virtue of the negative feedback to the emitter caused by emitter resistor 14 as is well-known in the art. Because transistor P1 is nonconductive, the common emitter node 18 is not held at the voltage of the high voltage supply 10, and the ECL transistors E1 and E2 are free to drive the outputs Y1 and Y1- as an ordinary current mode logic buffer/inverter under the influence of whatever data signals are present on the data inputs A and A- as in normal ECL differential mode operation. If the EN2 steering signal is not active, i.e., low, simultaneously with the active high state of the EN1 steering signal, the Y2 and Y2- outputs are deactivated. This results from the fact that the steering transistor N2 is not conductive thereby disabling the current source transistor CS2 from drawing current from common emitter node 20. When steering signal EN2 is low, the PMOS steering transistor P2 is conductive thereby driving the common emitter node 20 to the voltage of the high voltage source 10. This affirmatively reverse biases the base-emitter junctions of the ECL transistors E3 and E4 rather than leaving the common emitter node 20 floating so as to positively cut off the E3 and E4 transistors and prevent any signal leakage from the inputs A and A- to the outputs Y2 and Y2.

In some embodiments where this positive cutoff of the ECL transistors of the pair associated with whatever steering signal EN1 or EN2 is low, is not necessary and a floating common emitter node 18 or 20 provide adequate isolation between the input and output when the associated current source is not active, the PMOS transistors P1 and P2 can be eliminated.

If the enable signal EN2 is high, the NMOS steering transistor N2 is conductive and the PMOS steering transistor P2 is rendered nonconductive. This has the effect of activating the two outputs Y2 and Y2- by connecting the current source transistor CS2 to the low voltage supply thereby causing the transistors E3 and E4 to drive the outputs Y2 and Y2- in accordance with whatever data signals are on the A and A-data inputs. This is true regardless of whether steering signal EN1 is simultaneously active high. If EN1 is simultaneously low when EN2 is high, steering transistor N1 is nonconductive and steering transistor P1 is conductive. This drives common emitter node 18 to the voltage of the high voltage rail and reverse biases the emitter-base junctions of the ECL transistors E1 and E2 thereby isolating the inputs A and A- from the outputs Y1 and Y1-.

By controlling which of steering signals EN1 and/or EN2 are high, it is possible to connect the input signal pair A, A- to either or both of the output signal pairs Y1, Y1- or Y2, Y2-. Thus, by control of the states of signals EN1 and EN2, it is possible to electronically control the switching of very high speed signals at an input to any of a plurality of outputs without substantially slowing down the signals even though CMOS steering transistors are used. Because the resistivity of the NMOS steering transistors N1 and N2 is much lower than the resistance of the emitter feedback resistors 14 and 16, the presence of the NMOS transistors N1 and N2 in the path between the emitters of the current source transistors CS1 and CS2 to the low voltage rail does not appreciably affect the speed of operation of the circuit.

The structure of FIG. 1 can be extended to more ECL differential pairs driving more output pairs, but there is a limit imposed by the loading on the input signal lines A and A- caused by the junction capacitances of the ECL transistor bases. Also, since the beta factor of the ECL pairs is not infinite, adding more ECL pairs causes the base current to exceed accepted ECL limits of no more than 10–20 bases coupled to one signal. The preferred limit of the number of bases which can be coupled to input signal lines A and A- is from 4 to 8. It is preferable for the load on A and A- signal lines to not be dependent upon the number of transistors connected thereto.

Figure 2:
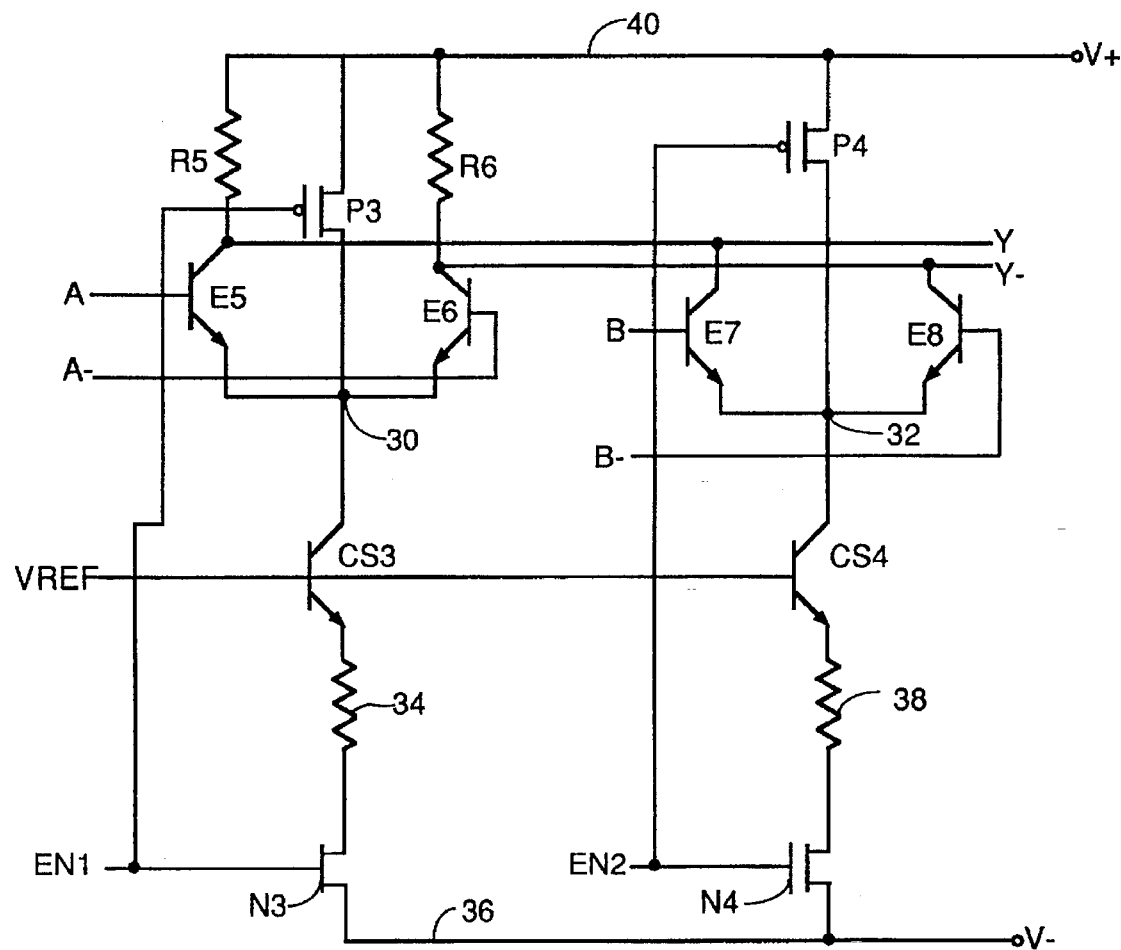
FIG. 2 is a circuit diagram for a multiple-input, single-output multiplexer according to one aspect of the teachings of the invention.

Referring to FIG. 2, there is shown a circuit diagram for a two-input-single-output multiplexer circuit according to the teachings of the invention. A first ECL transistor pair E5 and E6 share a common emitter node 30, while a second ECL transistor pair E7 and E8 share a common emitter node 32. Common emitter node 30 is coupled to a constant current source comprised of transistor CS3 and emitter feedback resistor 34. This constant current source is turned off and on by an NMOS steering transistor N3 which couples the current source to the low voltage supply line 36. The transistor pair E5 and E6 each have a load resistor, R5 and R6, respectively, which is shared with a second ECL transistor pair E7 and E8 via a pair of single output lines Y and Y-. The second transistor pair E7 and E8 share emitter node 32 and share a constant current source comprised of transistor CS4 and emitter feedback resistor 38. The CS4 constant current source is selectively coupled to the low voltage supply rail 36 by an NMOS steering transistor N4. As in the case of the embodiment of FIG. 1, two PMOS steering transistors P3 and P4 are used to positively control the voltage of common emitter nodes 30 and 32, respectively.

The first ECL transistor pair E5 and E6 is enabled when the enabling signal EN1 is high. This condition turns the NMOS transistor N3 on and couples the current source transistor CS3 to the low voltage supply 36. The transistors E5 and E6 are coupled to a high voltage supply line 40 through their respective load resistors R5 and R6. When EN1 is high, PMOS transistor P3 is off which releases the common emitter node 30. Thus, transistors E5 and E6 are enabled to drive the output lines Y and Y- under the influence of whatever signals are on the high speed input signal lines A and A-. Note that if EN1 is high, care must be taken to insure that EN2 is not simultaneously high as this would cause a conflict in that ECL pair E7 and E8 would be simultaneously trying to drive the output lines Y and Y- at the same time transistors E5 and E6 were trying to drive the same lines, possibly with conflicting signal levels. This conflict is avoided if the steering signal EN2 is low when steering signal EN1 is high, because a low EN2 causes PMOS transistor P4 to be turned on which drives the shared emitter node 32 to the voltage of the high voltage supply line 40. This disables E7 and E8 by reverse biasing the emitter-base junctions thereof. Likewise, when EN1 is low, transistors E5 and E6 are disabled in the same way.

In alternative embodiments of the circuit of FIG. 2, interlock circuitry is employed to prevent both EN1 and EN2 from being active high simultaneously. Also, in some embodiments, the PMOS transistors P3 and P4 can be omitted where leaving the shared emitter node floating is an acceptable way of disabling the ECL transistor pairs.

The multiple input, single output arrangement of FIG. 2 can be extended to many different input pairs driving many different ECL pairs sharing a single output pair, as will be apparent to those skilled in the art. If such a circuit were to be implemented as an integrated circuit, all transistors whose collectors are connected to the same output line could share the same collector tub on the integrated circuit die thereby creating vast savings in layout area. Thus, for example, four separate input pairs could drive four ECL transistor pairs sharing a single output pair and a single pair of load (pull up) resistors. The four transistors coupled to one output line of the output pair would share the same collector tub and likewise for the four transistors coupled to the other output line. At most one of the four ECL pairs would be enabled by its corresponding steering signal while all other steering signals would be inactive.

Figure 3:
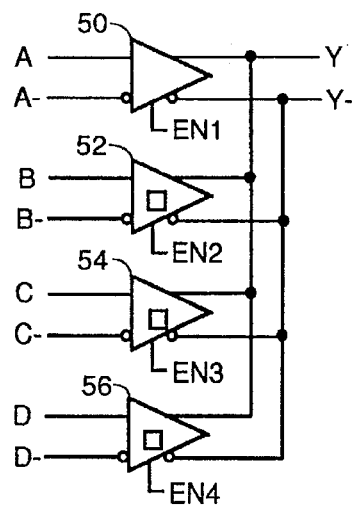
FIG. 3 is a circuit diagram of another notation for the multiplexer of FIG. 2 having four inputs and a single output.

Such an embodiment is shown symbolically in FIG. 3. In the notation used in FIG. 3, ECL pair E5 and E6 with pull up resistors R5 and R6 and their associated current sources and MOS steering transistors are represented by switch 50 while ECL pairs without pullup resistors such as transistors E7 and E8 and their associated current sources and MOS steering transistors are represented by switches 52, 54 and 56.

In FIG. 3, the first ECL transistor pair is driven by high speed signal input lines A and A- in the data path, while the second ECL transistor pair is driven by high speed input signal lines B and B-. Both ECL transistor pairs drive a single pair of shared output signal lines Y and Y- and share a single pair of pull up resistors.

Figure 4:
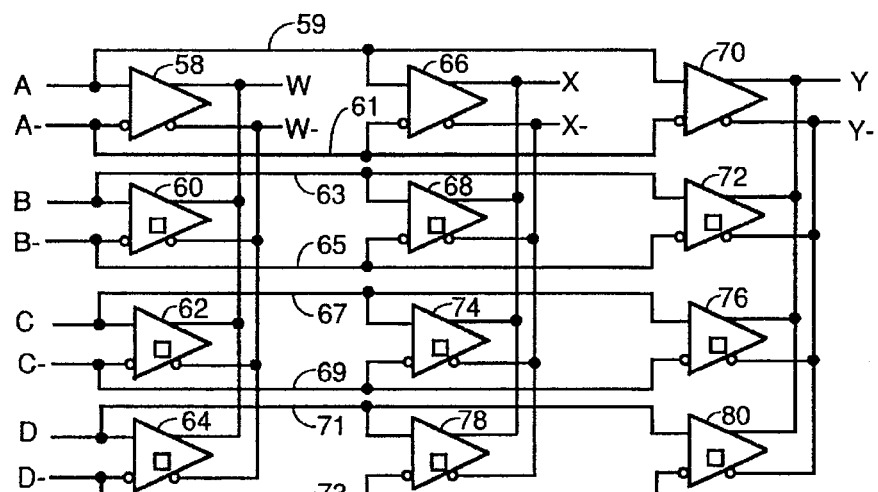
FIG. 4 is a circuit diagram for a crossbar switch having four inputs and three outputs using the notation of FIG. 3.

Referring to FIG. 4, there is shown a symbolic diagram of a four-input-three-output crossbar switch comprised of three modules like that shown in FIG. 3 interconnected such that the data inputs of the first module comprised of switches 58, 60, 62 and 64 also drive the data inputs from corresponding switches in the other two modules. Specifically, the A and A- data inputs to switch 58 are coupled not only to the data inputs of switch 58, but also to the data inputs of switches 66 and 68 via lines 59 and 61, and the B and B- data inputs drive the data inputs of both the switch 60 and the switch 68 and 72 via lines 63 and 65. The C and C- data inputs are similarly connected so as to drive the data inputs of switches 62, 74 and 76 via lines 57 and 69, and the D and D- data inputs are coupled to drive the data inputs of switches 64, 78 and 80. For clarity of the figure, the separate enable inputs of each switch are not shown, but each switch has an enable input coupled to receive a steering signal such as the signal EN1 in FIGS. 1 or 2. These steering signals are coupled to the CMOS steering transistors that control enabling of the ECL transistor pair of each switch in the manner described above for the circuits of FIGS. 1 and 2.

Operation of the crossbar switch of FIG. 4 is a straightforward function of activating selected ones of the steering signals. For example, if it is desired to pass the D and D- signals on to only the W and W- outputs, the enable signal to switch 64 would be activated and all other enable signals to all other switches would be inactive. If the D and D-outputs were to be steered to the X and X- outputs, the enable signal for only switch 78 would be active, and all other enable signals to all other switches would be inactive.

Any input pair can be coupled to any one or more output pairs in the architecture of FIG. 4, and two or more inputs can be coupled to two or more outputs simultaneously as long as no output is coupled to more than one input at any particular time. For example, the A and A- inputs can be coupled to the W and W- and X and X- inputs simultaneously while the D and D- inputs are simultaneously coupled to the Y and Y- inputs. Many other combinations are also possible as will be apparent to those skilled in the art.

The architecture of the crossbar switch of FIG. 4 can be extended to larger numbers of input pairs and/or output pairs.

Simulations of the operation of a 4×4 (four input pairs and four output pairs) crossbar switch having an architecture like that of the circuit of FIG. 4 has shown propagation delays of about ¼ nanosecond. This is much faster than the propagation delays of such crossbar switch circuits implemented using CMOS in the data path. That is, the time it takes for a change of level on any output pair to propagate through the circuit and cause a corresponding change in level on any one or more selected output pair is ¼ nanosecond.

The circuits shown in FIGS. 1 through 4 all use current mode logic which has a maximum output voltage swing on the order of 300 millivolts. If the output voltage swing is stretched to a value more than 300 millivolts, soft saturation or total saturation can occur in the ECL transistors. This is highly undesirable because saturation or soft saturation of current mode logic switches substantially decreases the switching speed thereof. Thus, in the preferred embodiment, emitter followers are used as output buffers so as to increase the permissible output voltage swing.

There are other reasons to use emitter followers. Specifically, emitter followers can be used to shift the voltage levels so as to drive other logic families, or they can be used to create higher current source or sink capacity for driving long lines etc.

To provide maximum flexibility, it is desirable to be able to couple the output of a current mode logic switch according to the teachings of the invention to any one or more of a number of emitter follower arrangements, some of which may have different characteristics such as different output voltage levels, logic swing or current source or sink capacity.

Figure 5:
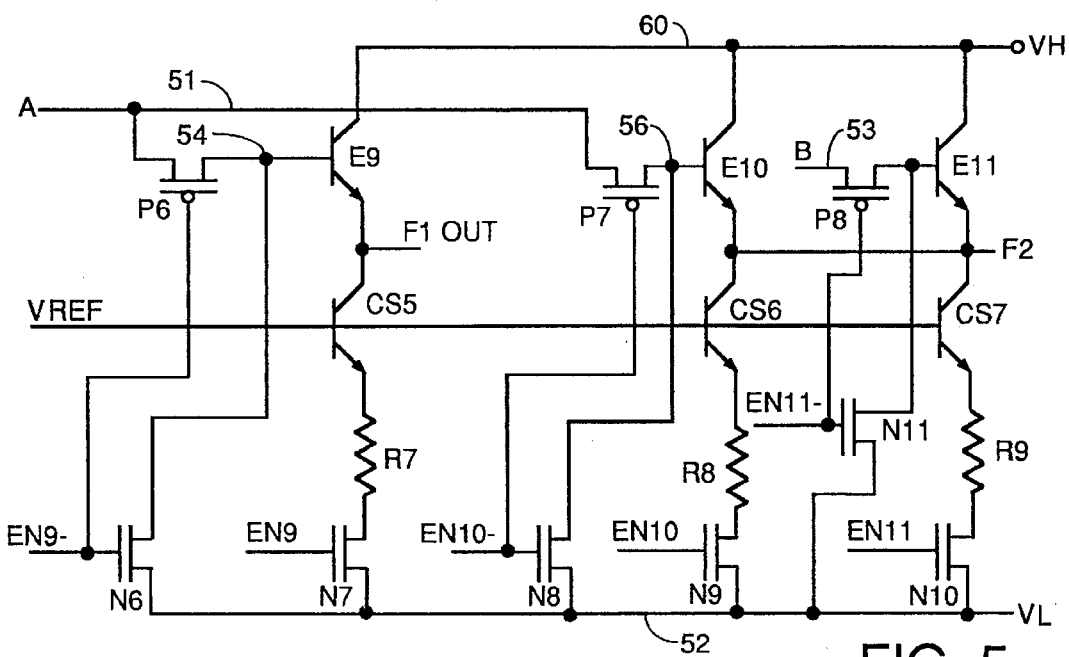
FIG. 5 is a circuit diagram of a typical set of high speed emitter followers for use with the circuits of FIGS. 1–4 or as a stand-alone, field-programmable switching array.

To provide this flexibility, the circuit of FIG. 5 may be used according to the teachings of the invention. In the circuit of FIG. 5, a data output line A from the output of a current mode logic switch or any other type of similar logic switch circuit is coupled via line 51 to two emitter followers comprised of ECL transistors E9 and E10 which drive output lines F1 and F2. Each of these emitter follower transistors has an associated current source and associated CMOS enabling circuitry. Specifically, transistor E9 drives output line F1 and has its emitter coupled to a current source transistor CS5 which has an emitter feedback resistor R7 and which has its base coupled to a constant reference voltage Vref as was the case with the current source transistors of the circuits of FIGS. 1–4. The CMOS enabling circuitry for emitter follower transistor E9 is comprised of NMOS transistors N6 and N7 and PMOS transistor P6. Likewise, emitter follower transistor E10 has its emitter coupled to a current source transistor CS6 having emitter feedback resistor R8. The base of the current source transistor CS6 is coupled to the constant reference voltage line Vref. The enabling CMOS circuitry for the current source E10 is comprised of NMOS transistors N8 and N9 and PMOS transistor P7.

Emitter follower E9 is enabled when the steering signal EN9 is active high and complementary steering signal EN9- is active low. This state causes NMOS transistor N7 to be turned on thereby activating the current source transistor CS5 by coupling its emitter to the low voltage supply line 52. Because EN9- is active low, NMOS transistor N6 is turned off and PMOS transistor P6 is turned on thereby allowing the base of transistor E9 to assume whatever voltage high speed input signal A current has. Note that although a PMOS transistor P6 is in the high speed signal path, the load on this transistor is very light comprised of only one ECL transistor base and one NMOS transistor drain. This light load does not appreciably slow down signal propagation. It is necessary to use the P6 transistor in the embodiment shown in FIG. 5 because it is necessary to disconnect the high speed signal A from the base of transistor E9 when the base is coupled to the low voltage supply 52 so that the high speed data signal is not loaded down thereby slowing signal propagation.

To disable emitter follower E9, steering signal EN9 is driven to its inactive low state and complementary steering signal EN9- is driven to its inactive high state. This state causes NMOS transistor N7 to turn off and NMOS transistor N6 to turn on simultaneously with PMOS transistor P6 turning off. This causes current source transistor CS5 to be disconnected from the low voltage supply line 52 and become inactive thereby disabling the emitter follower transistor E9. Simultaneously, the base 54 of NPN transistor E9 is coupled to the low voltage supply 52 to reverse bias the base-emitter junction and the base 54 is cut off from the A data input line 51 by virtue of transistor P6 turning off. By coupling the base 54 of transistor E9 to the low voltage supply, the base-emitter junction of NPN transistor is reverse biased thereby preventing any voltage source coupled to the F1 output from accidently turning transistor E9 on.

Emitter follower E10 works in the same fashion as emitter follower E9. However, it may have a different physical geometry or emitter feedback resistor R8 may have a different value so as to present different voltage levels on output line F2. Further, emitter follower E10 may be designated so as to be able to source more current to output line F2 to drive a long line. Thus, when steering signal EN10 is active high and steering signal EN10- is active low, NMOS transistor N9 is on enabling the current source transistor CS6 and NMOS transistor N8 is off while PMOS transistor P7 is on thereby connecting the base 56 of NPN transistor E10 to high speed data input A. To turn off E10, steering signal EN10 is made inactive low and steering signal EN10- is made inactive high.

Note that the architecture of the circuit of FIG. 5 allows the high speed data signal A to drive either output F1 or output F2, or both simultaneously or neither depending upon the states of the steering signals EN9 and EN10 and their complements. Another high speed data input, B, on line 51 is coupled to the base of an NPN emitter follower transistor E11 which also drives output F2. If level shifting of the output swing of output F2 were desired when driven by input B, emitter follower transistor E11 could be replaced by two transistors in series such that two base emitter drops of approximately 850 millivolts would be imposed between the high voltage supply line 60 and the output F2 when the emitter follower E11 is turned on. Emitter follower E11 and its steering circuitry works the same way as emitter followers E9 and E10. Specifically, when steering signal EN11 is active high and its complement EN11- is active low, NMOS transistor N10 is on and activates current source transistor CS7 by coupling the emitter thereof to low voltage supply line 52. The base of transistor CS7 is coupled to the constant reference voltage Vref as are the bases of current source transistors CS5 and CS6. Simultaneously, NMOS transistor N11 is turned off by the low state of EN11- and PMOS transistor P8 is turned on thereby connecting the high speed data input B to the base of emitter follower transistor E11. This causes the changes in logic level of high speed data input signal B to be reflected on output F2 while imposing the buffering, level shifting and current boosting benefits of the emitter follower E11 between the high speed data input signal B and the output signal F2 which follows it.

Thus, by driving steering signal EN11 active high and steering signal EN10 inactive low and the complementary steering signals to their corresponding active/inactive states, it is possible to drive output F2 with input B. Likewise, by driving steering signal EN10 active high and steering signal EN11 inactive low and the complementary steering signals to their corresponding active/inactive states, it is possible to drive output F2 with input A. It is not permitted to have both steering signals EN10 and EN11 active high at the same time, although it is permitted to have both inactive low simultaneously.

Note that the inputs A and B on lines 51 and 53 may be coupled to any of the outputs shown in FIG. 1–4 such as Y or Y- etc., and note that duplicate emitter follower circuitry may be used to couple to the complementary outputs. Also, the outputs F1 and F2 may be coupled to the inputs of the single ended circuit of FIG. 6 to provide any necessary one Vbe drop (base-emitter voltage drop) to properly bias that circuit. The number of possible permutations and combinations of the fast switching circuits and emitter follower circuitry that does not impede the switching speed according to the teachings of the invention are too numerous to draw them all, but they will be apparent to those skilled in the art. Any fast switching circuit that uses MOS enabling circuitry that is substantially removed from the date path to enable the switch or do a steering function for the high speed data signals is equivalent to what is taught herein and intended to be within the scope of the claims appended hereto.

The consequence of use of the architecture of FIG. 5 in conjunction with the architecture of any of FIGS. 1–4 is that the high speed switches of FIGS. 1–4 may be coupled to any other type of logic family regardless of the logic levels of the logic family to which the high speed switches are to be coupled. The level of the output signals at outputs F1 and F2 can be raised by raising the voltage at the high voltage supply line 60 or changing the values of emitter feedback resistors R7, R8 and R9 and changing the characteristics of the current source transistors and/or changing the reference voltage Vref to alter the level of current flowing through the emitter feedback resistors. Likewise, output level voltages can be shifted downward by coupling more emitter follower transistors in series so that all transistors in the chain turn on or off simultaneously with changes in the input signal levels and so as to impose their base-emitter voltage drops in series between the high voltage supply line 60 and the corresponding output. This level shifting can be done without loss of the advantage of ECL speeds. This provides great flexibility to designers. For example, in well-known differential mode cascade logic, one set of data inputs coupled to the lower differential pair substituted for the normal current source must be driven between level changes which are uniformly one base-emitter voltage drop (approximately 850 millivolts) below the corresponding levels of the other set of data inputs coupled to the upper differential pair. This can be done using the emitter follower technology of FIG. 5, for example by driving one set of inputs with the F1 output and driving the other set of inputs coupled to the lower differential pair with output F2 and substituting a pair of series coupled emitter followers for single emitter followers E10 and E11.

Those skilled in the art will appreciate that the concepts illustrated in FIG. 5 can be extended such that input A can drive more emitter followers and more outputs, and the crossbar switching capabilities of input A or B being able to drive input F2 can be extended to more inputs and outputs by modification of the circuit of FIG. 5. Likewise, the concepts illustrated in FIGS. 1–4 may be extended to more inputs and more outputs and can be extended to single ended technology. Generally, differentially coupled current mode logic devices are preferred, because the logic swing can be reduced with adequate noise immunity and therefore great speeds can be achieved. However, where integrated circuit space is an issue, and the number of transistors is to be held down, single ended logic can also be used.

Figure 6:
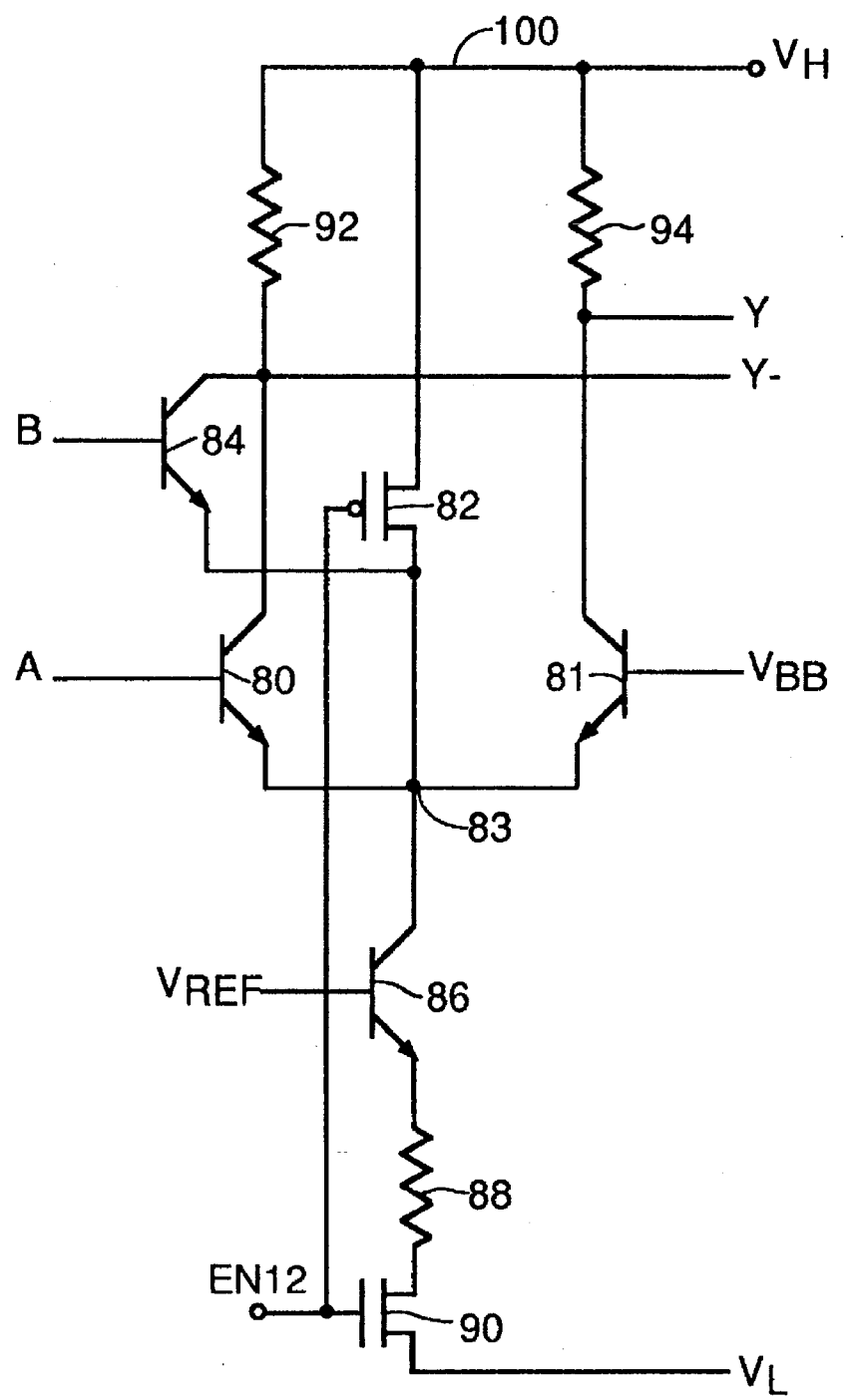
FIG. 6 is a circuit diagram of one example of how the structures of FIGS. 1–4 can be implemented in single ended ECL technology.

For example, a single-ended, fast or gate employing the teachings of the invention is shown in FIG. 6. In this circuit, a differentially coupled pair current mode NPN transistors 80, 81 and 84 are coupled to share a common node 83. A reference signal Vbb is coupled to the base of transistor 81, and high speed data input signals A and B coupled to the bases of transistors 80 and 81 have logic states which swing both above and below the level of Vbb. A constant current source comprised of transistor 86 and resistor 88 selectively drives the common node 83 when NMOS transistor 90 is turned on. This occurs when steering signal EN12 is active high. When this occurs, PMOS transistor 82 turns off and common node 83 is free to seek whatever voltage it normally assumes when the differential pair is enabled. The transistors 84, 80 and 81 then drive the outputs Y and Y-. Pullup resistors 92 and 94 couple the outputs to the high voltage source. The voltage swings of the signals on inputs A and B can be increased to increase noise immunity, but the high level of either signal cannot be higher than one base-emitter voltage drop below the level of Vh on the line 100. Thus, an emitter follower according to the teachings of FIG. 5 could be used to drive the A and B inputs if necessary to provide the necessary one base-emitter drop. The concept of FIG. 6 can be extended to any of the other switches or arrays shown in FIGS. 1–4 as will be apparent to those skilled in the art. Further, although NPN bipolar current mode logic technology is used for illustration, PNP bipolar technology could also be used, and any differentially coupled circuit could also be single ended. Further, other high speed switching technologies either now existing or to be invented in the future could also be used to implement the teachings of the invention if the slower enabling/steering logic is kept out of the high speed data path.

What is claimed is:

1. A crossbar switch, comprising:

a plurality of high speed signal inputs for receiving high speed data signals;

a first multiplexer having a plurality of data inputs equal in number to the number of said plurality of high speed signal inputs and each coupled to one of said plurality of high speed signal inputs, said first multiplexer having a shared data output, said first multiplexer comprised of a plurality of switching devices each of which is coupled to one of said plurality of high speed signal inputs via a corresponding one of said data inputs of said first multiplexer, and each of said plurality of switching devices having an enabling circuit coupled thereto for receiving a steering signal assigned to that switching device so as to individually enable said switching device, said enabling circuitry controlled by a steering signal assigned to that switching device so as to be able to drive said shared data output of said first multiplexer in accordance with data received at the corresponding high speed signal input to which said switching device is coupled;

one or more other multiplexers, each having a corresponding plurality of data inputs equal in number to the number of said high speed signal inputs, each of said plurality of data inputs of said one or more other multiplexers coupled to one of said plurality of high speed signal inputs, and each of said one or more other multiplexers having a shared data output, each of said one or more other multiplexers comprised of a plurality of switching devices each of which has a data input which is coupled to a data input of the one of said one or more other multiplexers of which said switching device is a part, each of said switching devices of said one or more other multiplexers including an enabling circuit coupled thereto, said enabling circuit controlled by a steering signal assigned to that switching device so as to individually enable the switching device to which said enabling circuit is coupled in response to said steering signal assigned to said switching device, so as to control said switching device to drive the shared data output of the multiplexer of which the switching device so enabled is a part in response to the data received at the high speed signal input to which said switching device is coupled, such that by proper manipulation of said steering signals for said first multiplexer and said one or more other multiplexers, each of the shared outputs can be driven with signals received at any one of said high speed signal inputs so long as no more than one high speed signal input is used to drive any shared data output at any particular time; and wherein each of said switching devices coupled to one of said plurality of data inputs in said first multiplexer and each of said switching devices coupled to one of said plurality of data inputs of said one or more other multiplexers comprises a high speed, differential pair of bipolar transistors controlling data flow in the data path between said high speed signal inputs and said shared data outputs and wherein each said differential pair of bipolar transistors has a common emitter node and is integrated on an integrated circuit with the corresponding enabling circuit to which said switching device is coupled, and wherein each said enabling circuit is comprised of integrated CMOS transistors which are coupled to said common emitter node of the differential pair of bipolar transistors to which said enabling circuit is coupled, said CMOS transistors for selectively coupling either a first voltage to said common emitter node when the steering signal assigned to said switching device is in a first logical state so as to enable said switching device or coupling a second voltage to said common emitter node when said steering signal is in a second logical state so as to disable said switching device, thereby keeping said CMOS transistors of said enabling circuit of each switching device out of the high speed signal data path between any of said high speed signal inputs and any of said shared data outputs.

2. A semiconductor integrated circuit, comprising:

a high reference conductor for coupling to a first voltage supply;

a low reference conductor for coupling to a second voltage supply, said second voltage being lower than said first voltage;

an enable input for receiving an enable signal;

a first bipolar transistor having a base, a collector and an emitter and a base-emitter junction, said collector for coupling to said high reference conductor;

a current source having a first terminal coupled to said emitter of said first bipolar transistor and having a second terminal;

a first MOS transistor means having source and drain terminals coupled to said low reference conductor and said second terminal of said current source, respectively, and having a gate terminal coupled to said enable input, for cutting off current flow between said second terminal of said current source and said low reference conductor thereby disabling said first bipolar transistor when said enable signal is in a first logical state and for allowing current to flow between said current source and said low reference conductor thereby enabling said first bipolar transistor when said enable signal is in a second logical state; and a second MOS transistor means having a gate terminal coupled to said enable input, said second MOS transistor means having source and drain terminals coupled to said first bipolar transistor in such a way so as to be able to affect the voltage drop across said base-emitter junction, said second MOS transistor means for immediately forcing an alteration of the voltage drop across said base-emitter junction of said first bipolar transistor so as to cut off conduction between said collector and said emitter thereof thereby disabling said first bipolar transistor when said enable signal is placed in said first logical state, and, when said enable signal is in said second logical state, for ceasing to force an alteration of the voltage drop across said base-emitter junction of said first bipolar transistor so that said bipolar transistor is no longer disabled.

3. The integrated circuit of claim 2, wherein said collector of said first bipolar transistor is coupled to said high reference conductor through a load resistance, and further comprising:

a second bipolar transistor having a base, a collector and an emitter and a base-emitter junction, said collector coupled to said high reference conductor through a load resistance, and said emitter coupled to said emitter of said first bipolar transistor;

and wherein said second MOS transistor is coupled between said high reference conductor and said emitters of said first bipolar transistor and said second bipolar transistor such that when said enable signal is in a state indicating said first bipolar and second bipolar transistors are to be deactivated, said second MOS transistor causes the base-emitter junctions of said first bipolar transistor and said second bipolar transistor to be reverse biased.

4. The integrated circuit of claim 2 wherein said first MOS transistor has its source and drain terminal coupled between said second terminal of said current source and said low reference conductor such that current must flow through a channel region of said first MOS transistor to reach said low reference conductor, and wherein said second MOS transistor has its source and drain coupled between said base of said first bipolar transistor and said low reference conductor such that when said enable signal is in a state to disable said first bipolar transistor, the base of said first bipolar transistor is forced to approximately the voltage on said low reference conductor, and further comprising a third MOS transistor having a gate coupled to said enable signal and having a source and drain coupled between a high speed data input and said base of said first bipolar transistor such that when said enable signal is in a state to disable said first bipolar transistor, any high speed data presented at said high speed data input is not coupled through said third MOS transistor to said base of said first bipolar transistor, and when said enable signal is in a state to enable said first bipolar transistor, any high speed data presented at said high speed data input is coupled through said third MOS transistor to said base of said first bipolar transistor.

5. The integrated circuit of claim 3 wherein the combination of said first bipolar transistor, said second bipolar transistor and said first and second MOS transistors define a first ECL gate having said bases of said first bipolar and second bipolar transistors acting as a pair of differential inputs for receiving a first high speed differential data signal, and said collectors of said first bipolar and second bipolar transistors acting as a pair of differential outputs and said enable input acting as the enable input for receiving a first enable signal that enables operation of said first ECL gate when said first enable signal is active, and further comprising a second ECL gate having the same structure and operation as said first ECL gate, said second ECL gate having its enable input for receiving a second enable signal to enable said second ECL gate when active, and having the second ECL gate's pair of differential inputs for receiving a second differential high speed data signal, said second ECL gate having its differential outputs coupled to said differential outputs of said first ECL gate, thereby defining a two-input, one-output selector switching circuit wherein said first high speed differential data signal is coupled to said differential outputs when said first enable signal is active and said second enable signal is not active, and wherein said second high speed differential data signal is coupled to said differential outputs when said second enable signal is active and said first enable signal is not active.

6. The integrated circuit of claim 3 wherein the combination of said first bipolar transistor, said second bipolar transistor and said first and second MOS transistors define a first ECL gate having said bases of said first bipolar and second bipolar transistors acting as a pair of differential inputs for receiving a first high speed differential data signal, and said collectors of said first bipolar and second bipolar transistors acting as a pair of differential outputs and said enable input acting as the enable input for receiving a first enable signal that enables operation of said first ECL gate when said first enable signal is active, and further comprising a second ECL gate having the same structure and operation as said first ECL gate, said second ECL gate having its enable input for receiving a second enable signal to enable said second ECL gate when active, and having the second ECL gate's pair of differential inputs for receiving a second differential high speed data signal, and wherein said second ECL gate has its differential inputs coupled to receive said first high speed differential data signal, such that by activating said first enable signal, said first high speed differential data signal can be coupled to the differential outputs of said first ECL gate, and by activating said second enable signal, said first high speed differential data signal can be coupled to said differential outputs of said second ECL gate.

7. The integrated circuit of claim 3 wherein the combination of said first bipolar transistor, said second bipolar transistor and said first and second MOS transistors define a first ECL gate having said bases of said first bipolar and second bipolar transistors acting as a pair of differential inputs for receiving a first high speed differential data signal, and said collectors of said first bipolar and second bipolar transistors acting as a pair of differential outputs and said enable input acting as the enable input for receiving a first enable signal that enables operation of said first ECL gate when said first enable signal is active, and further comprising a second ECL gate having the same structure and operation as said first ECL gate, said second ECL gate having its enable input for receiving a second enable signal to enable said second ECL gate when active, and having the second ECL gate's pair of differential inputs for receiving a second differential high speed data signal, and wherein said second ECL gate has its differential inputs coupled to receive said first high speed differential data signal, such that by activating said first enable signal, said first high speed differential data signal can be coupled to the differential outputs of said first ECL gate, and by activating said second enable signal, said first high speed differential data signal can be coupled to said differential outputs of said second ECL gate, and further comprising a third ECL gate having the same structure and operation as said first ECL gate, said third ECL gate having its enable input for receiving a third enable signal to enable said third ECL gate when active, and having the third ECL gate's pair of differential inputs for receiving a second differential high speed data signal, and wherein said differential outputs of said third ECL gate are coupled to said differential outputs of said first ECL gate such by activating said third enable input and deactivating said first enable input, said second differential high speed data signal can be coupled to said differential outputs of said first ECL gate, and further comprising a fourth ECL gate having the same structure and operation as said first ECL gate, said fourth ECL gate having its enable input for receiving a fourth enable signal to enable said fourth ECL gate when active, and having the fourth ECL gate's pair of differential inputs coupled so as to receive said second differential high speed data signal, and wherein said differential outputs of said fourth ECL gate are coupled to said differential outputs of said second ECL gate such by activating said fourth enable signal and deactivating said second enable signal, said second differential high speed data signal can be coupled to said differential outputs of said second ECL gate.

8. The integrated circuit of claim 3 further comprising a third bipolar transistor having a collector coupled to said collector of said first bipolar transistor and having an emitter coupled to said emitter of said first bipolar transistor, and having a base serving as an input for receiving a first high speed data signal, and wherein said base of said first bipolar transistor is receiving a high speed data signal, and wherein said base of said second bipolar transistor is coupled to receive a reference voltage which is between the logic levels which can be assumed by the data signals coupled to the bases of said third bipolar transistor and said first bipolar transistor, thereby implementing a high speed OR gate.

9. A method of disabling a bipolar transistor coupled by a current source to a first reference voltage source and having a collector coupled to a second reference voltage source which outputs a voltage higher than the voltage output by said first reference voltage source, comprising:

using a first MOS transistor having source and drain terminals connected between said current source and said first reference voltage to cut off current flow between said current source and said first reference voltage source by appropriate setting of the logic state of an enable signal applied to a gate terminal of said first MOS transistor; and using a second MOS transistor to reverse bias a base-emitter junction of said bipolar transistor, said second MOS transistor having source and drain terminals coupled between said second reference voltage source and an emitter terminal of said bipolar transistor and having a gate coupled to receive said enable signal, by appropriately setting said logic state of said enable signal such that when said first MOS transistor is cutting off current flow between said current source and said low reference voltage source, said second MOS transistor is simultaneously coupling said second reference voltage to said emitter of said bipolar transistor thereby reverse biasing the base-emitter junction thereof.

* * * * *